United States Patent [19]

Caprari

[11] 4,378,583

[45] Mar. 29, 1983

[54] XENON FLASH LAMP SHIELD

[75] Inventor: Fausto Caprari, East Brunswick, N.J.

[73] Assignee: RCA Corporation, New York, N.Y.

[21] Appl. No.: 215,089

[22] Filed: Dec. 10, 1980

[51] Int. Cl.³ ............................................. F21V 7/00
[52] U.S. Cl. ..................................... 362/263; 362/18; 362/303; 362/305; 350/269; 350/277
[58] Field of Search ..................... 362/16, 17, 18, 303, 362/263, 305; 350/269, 271, 281, 266, 277

[56] References Cited

U.S. PATENT DOCUMENTS

| 3,646,349 | 2/1972 | Rietveld | 350/271 |
| 3,668,990 | 6/1972 | Hayes | 350/271 |
| 3,860,335 | 1/1975 | Caprari | 353/102 |
| 3,900,727 | 8/1975 | Hutz | 362/302 |

OTHER PUBLICATIONS

Goncz, et al.; Journal of the Optical Society of America, vol. 56, No. 1, 87–92, Jan. 1966.
Doane, et al.; Solid State Technology, Aug. 1980, pp. 101–114.

Primary Examiner—Donald P. Walsh
Attorney, Agent, or Firm—Birgit E. Morris; Donald S. Cohen; Joseph D. Lazar

[57] ABSTRACT

The flash lamp shield is used with helical xenon flash lamps to shield the radiation from high current density regions adjacent the anode and cathode of the flash lamp. The inventor has found that helical xenon flash lamps including the shield are particularly effective in exposure systems to expose photoresist materials used in semiconductor manufacturing processes.

2 Claims, 3 Drawing Figures

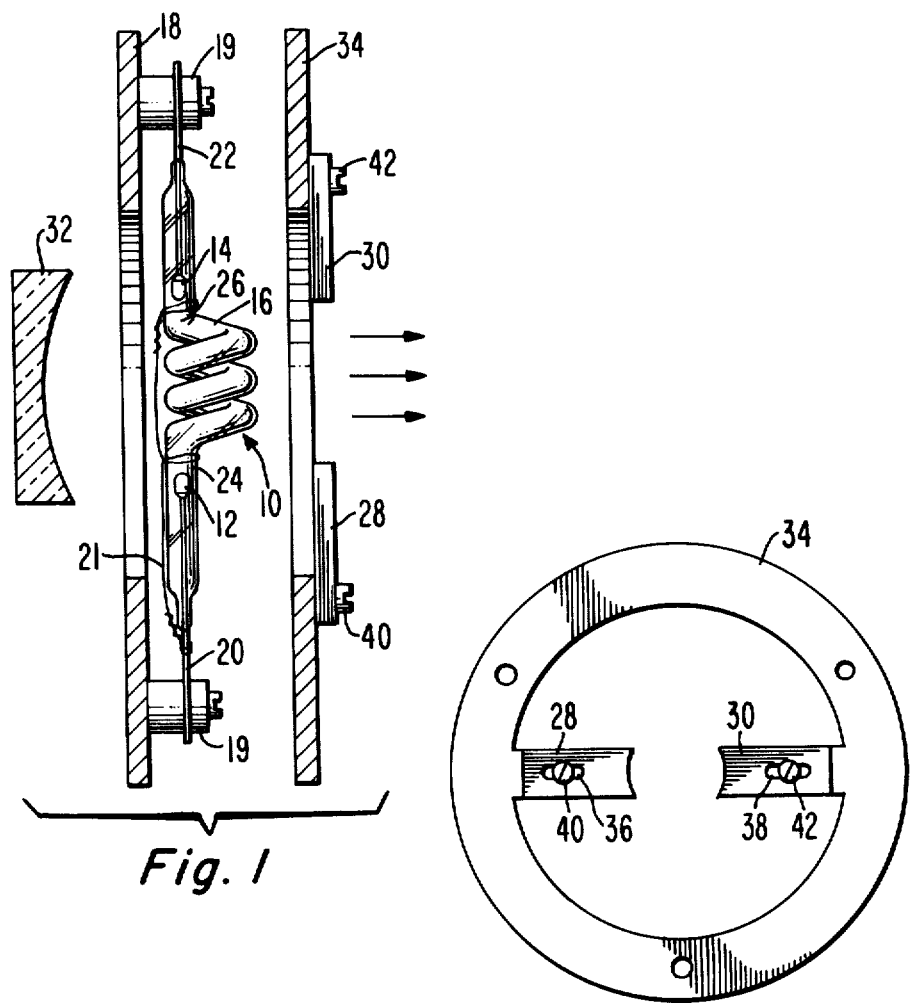

XENON FLASH LAMP SHIELD

BACKGROUND OF THE INVENTION

The present invention relates to the use of xenon flash lamps in the manufacture of integrated circuit devices.

In the manufacture of integrated circuit devices various photolithographic processes are conducted. In such processes, a light sensitive material called a photoresist, is exposed by a flash lamp acting through a photomask, whereby a pattern is defined upon the photoresist. The optical lithography process is described more fully in U.S. Pat. No. 3,860,335 entitled *OPTICAL SYSTEM* which issued on Jan. 14, 1975 to Fausto Caprari and in an article entitled *OPTICAL LITHOGRAPHY IN THE 1-μM LIMIT*, by D. A. Doane, Solid State Technology, August, 1980, pages 101-113.

The inventor has found that it is desirable to use a xenon flash lamp to expose photoresist material, because the light output of such a flash lamp is extremely effective in polymerizing the exposed photoresist. Unfortunately, xenon flash lamps designed specifically for use in semiconductor processes are not available. Accordingly, attempts have been made to utilize xenon flash lamps of the type which are available and to adapt them for use in semiconductor manufacture. It was observed, however, that the quality of the exposure produced by the available flash lamps, particularly the helical flash lamps was not as good as expected. Studies conducted by the inventor indicated to him that the quality of the exposure was degraded from what an ideal print source would produce. Further studies indicated that helical xenon flash lamps had assymetrical light output present in the anode and cathode axis of the xenon lamp.

The inventor determined that the primary reason for the assymetry is the presence of two very high current density spots located in close proximity to the anode and to the cathode of the helical flash lamp. At these locations the current density is in the neighborhood of $10^6$ A/cm$^2$, resulting in a very high ultra-violet (UV) output from these points. Such UV radiation was traced as the source of the distortion in the photoresist.

SUMMARY OF THE INVENTION

The present invention is a shield which allows for the use of a helical xenon flash lamp in an exposure system for photoresist material of the type used in semiconductor manufacturing. The invention includes means for permitting light to be transmitted from the helical portion of the flash lamp while blocking the light output from the high current density areas adjacent to the anode and cathode of the flash lamp.

BRIEF DESCRIPTION OF THE DRAWING

In the drawing:

FIG. 1 is a schematic representation of a mounted xenon flash lamp in an optical system which includes the shield of the present invention;

FIG. 2 is a front view of one embodiment of the invention, showing the flange on which the shields of the present invention are mounted and their position thereon and FIG. 3 is a front view of a second embodiment of the invention, showing an alternative method of mounting and adjusting the shields.

DETAILED DESCRIPTION OF A PREFERRED EMBODIMENT

Referring to FIG. 1, a helical xenon flash lamp 10 is shown. The flash lamp 10 has an anode 12 and a cathode 14 at opposite ends thereof. The lamp comprises a substantially evacuated tube 16 which is wound as a helix. The tube 16 contains xenon gas and is the type of tube which is available from vendors such as ILC Technology of Sunnyvale, Calif., as their model L-3107, or EG&G of Salem, Mass., as their model FXQ-358. The flash tube 10 is mounted on a supporting member 18 which provides means 19 through which an anode rod 20 and a cathode rod 22 extend, whereby electrical connection can be made to the lamp 10. The lamp 10 also includes a trigger wire 21.

In the aforementioned studies conducted by the inventor, the effect of high current density spots 24, 26 in the areas adjacent to the anode 12 and cathode 14, respectively, were noted. In accordance with the present invention, shields 28, 30 prevent radiation, such as ultraviolet light (represented by the arrows in FIG. 1), from the high current density spots 24, 26 from being transmitted from the flash lamp 10 through the optical system being used. The optical system may include a mirror 32, as shown. Accordingly, the distortion which was previously noted has been eliminated through the use of the shields 28, 30.

Referring now to FIG. 2, the shields 28, 30 are preferably formed of a non-reflective material, such as blackened aluminum, in order to prevent them from reflecting light back onto the optical system. The shields 28, 30 are slidably mounted on a flange 34 which mounts in front of the supporting member 18 on which the lamp 10 is mounted. In a first embodiment of the invention, the shields 28, 30 include slots 36, 38 formed therein in order that they may be mounted using screws 40, 42 which may be suitably loosened in order to move the shields into proper position.

The reason that the shields are preferably adjustably mounted is to allow them to be moved in order to accommodate particular lamps which are subject to manufacturing variances. In addition, the use of the adjustable mount on the shields allows different size lamps 10 to be used in the optical system.

As the preferred optical system can utilize lamps having different size helixes, typically either 0.8 inches in diameter or 1.0 inches in diameter, the use of the slidable mount on the shield assures that the optical system can handle the different lamp sizes.

As a result of the use of the shields in the optical system of the preferred embodiment of the invention, the distortion which was previously noted along the axis of the lamp has been eliminated. Accordingly, helical flash lamps may be used in the optical definition of photoresist material in semiconductor processes. Such lamps have been found to be extremely useful in that they are very efficient and stable light producers. In addition, they exhibit a long life-time, low power consumption, and high power output. Also, the use of xenon flash lamps operated at high current densities (i.e. about 3000 A/cm$^2$) has proved to provide high light output capabilities in the deep UV spectral range (200-260 nm) which have been found to be extremely effective in the exposure of photoresist materials.

Referring now to FIG. 3 an alternative embodiment of the invention is shown. In the embodiment shown in FIG. 3, the shields 44, 46 are mounted on a supporting ring 48 which is constructed in a manner that will allow the shields 44, 46 to be adjusted by turning screws 50, 52. The screws 50,52 pass through threaded sections 54, 56 of the shields 44, 46, respectively. An advantage of the embodiment shown in FIG. 3 is that the screws 50, 52 may be turned without opening up the optical system, which requires partial disassembly thereof. Thus, use of the embodiment shown in FIG. 3 can save time and effort when a flash tube is installed in the system.

I claim:

1. An improved optical system comprising:

a helical xenon tubular flash lamp;

said lamp having a cathode and anode at respective ends of the tubular lamp at which ends respectively very high current density light spots exist;

a mirror positioned to reflect light from said lamp back to said lamp to thereby enhance the light from said lamp; and means for allowing the light of the helical portion of the flash lamp to be transmitted in a direction opposite from the position of said mirror while blocking the light output from the high current density spots of said flash lamp adjacent to the anode and the cathode;

said means comprising an opaque shield having a non-reflecting surface facing said lamp and said mirror whereby said high density light spots are not transmitted in said opposite direction with light from said helical portion.

2. The improved optical system of claim 1 further comprising means for adjusting the position of said shield to block the light from said spots.

* * * * *